(12) United States Patent
Lee

(10) Patent No.: US 10,054,967 B2
(45) Date of Patent: Aug. 21, 2018

(54) SEMICONDUCTOR DEVICE INCLUDING REFERENCE VOLTAGE GENERATION CIRCUIT CONTROLLING LEVEL OF REFERENCE VOLTAGE

(71) Applicant: SK hynix Inc., Icheon-si Gyeonggi-do (KR)

(72) Inventor: Myung Hwan Lee, Cheonan-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/471,794

(22) Filed: Mar. 28, 2017

(65) Prior Publication Data

US 2018/0039295 A1   Feb. 8, 2018

(30) Foreign Application Priority Data

Aug. 2, 2016 (KR) .................. 10-2016-0098424

(51) Int. Cl.
| | |
|---|---|
| G05F 1/46 | (2006.01) |
| G11C 5/14 | (2006.01) |
| G11C 7/04 | (2006.01) |
| G05F 1/59 | (2006.01) |
| G05F 1/575 | (2006.01) |

(52) U.S. Cl.
CPC .............. *G05F 1/465* (2013.01); *G05F 1/463* (2013.01); *G05F 1/575* (2013.01); *G05F 1/59* (2013.01); *G11C 5/147* (2013.01); *G11C 7/04* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,937,087 | B2 * | 8/2005 | Sim | G01K 3/005 |
| | | | | 327/512 |
| 7,106,127 | B2 * | 9/2006 | Sim | G01K 3/005 |
| | | | | 327/512 |
| 8,344,751 | B2 * | 1/2013 | Cho | H04L 25/0298 |
| | | | | 326/30 |
| 8,876,374 | B2 * | 11/2014 | Jeong | G01K 7/22 |
| | | | | 374/163 |
| 9,397,661 | B2 * | 7/2016 | Ha | H03K 19/00369 |
| 2016/0071567 | A1 | 3/2016 | Fujita | |

FOREIGN PATENT DOCUMENTS

KR   1020160040045 A   4/2016

* cited by examiner

*Primary Examiner* — An Luu
(74) *Attorney, Agent, or Firm* — William Park & Associates LTD.

(57) ABSTRACT

A semiconductor device may be provided. The semiconductor device may include a reference voltage generation circuit suitable for controlling a level of a reference voltage depending on an internal resistance value, and controlling the level of the reference voltage depending on the internal resistance value.

19 Claims, 8 Drawing Sheets

SEMICONDUCTOR DEVICE INCLUDING REFERENCE VOLTAGE GENERATION CIRCUIT CONTROLLING LEVEL OF REFERENCE VOLTAGE

CROSS-REFERENCE TO RELATED APPLICATION

The present application claims priority under 35 U.S.C. § 119(a) to Korean Patent Application No. 10-2016-0098424 filed on Aug. 2, 2016 in the Korean Intellectual Property Office, which is incorporated herein by reference in its entirety.

BACKGROUND

1. Technical Field

Embodiments of the present disclosure may generally relate to a semiconductor device configured for controlling the level of a reference voltage depending on a temperature.

2. Related Art

A semiconductor device uses various reference voltages to receive data and discriminate the logic level of an internal signal. Since the reference voltages serve as absolute voltages for discriminating the logic levels of data and an internal signal, it is important to check the level ranges to allow the data and the internal signal to be received without an error.

In general, a semiconductor device which generates a reference voltage (VREF) operates in a scheme in which one of a plurality of levels generated through voltage division is selected as the level of the reference voltage (VREF). Also, reference voltage training capable of setting the level of the reference voltage VREF generated in this way is being implemented.

SUMMARY

In an embodiment, a semiconductor device may be provided. The semiconductor device may include a reference voltage generation circuit suitable for controlling a level of a reference voltage depending on an internal resistance value, and controlling the level of the reference voltage depending on the internal resistance value.

In an embodiment, a semiconductor device may be provided. The semiconductor device may include a reference voltage generation circuit configured for controlling a level of an internal reference voltage depending on an internal resistance value, the internal resistance value dependent on first code signals, and outputting a level of a reference voltage, dependent on the first code signals and second code signals, based on a second control voltage, the second control voltage generated based on a comparison between the internal reference voltage and a feedback voltage.

In an embodiment, wherein the reference voltage generation circuit is configured for controlling the level of the internal reference voltage depending on the internal resistance value, the internal resistance value being dependent on the first code signals at a first temperature, and wherein the reference voltage generation circuit is configured for outputting the level of the reference voltage, dependent on the first code signals and the second code signals at a second temperature, based on the second control voltage.

DETAILED DESCRIPTION

Hereinafter, a semiconductor device will be described below with reference to the accompanying drawings through various examples of embodiments.

Various embodiments may be directed to a semiconductor device which controls the level of a reference voltage in the cases where an internal temperature is a high temperature and a low temperature and in which code signals for controlling the level of the reference voltage for a high temperature and a low temperature according to a result of controlling the level of the reference voltage are used by being stored, thereby being capable of generating a stable reference voltage even though a temperature varies.

According to the embodiments, advantages may be provided in that the level of a reference voltage is controlled in the cases where an internal temperature is a high temperature and a low temperature, and code signals for controlling the level of the reference voltage for a high temperature and a low temperature according to a result of controlling the level of the reference voltage are used by being stored, whereby it may be possible to generate a stable reference voltage even though a temperature varies.

Figure 1:
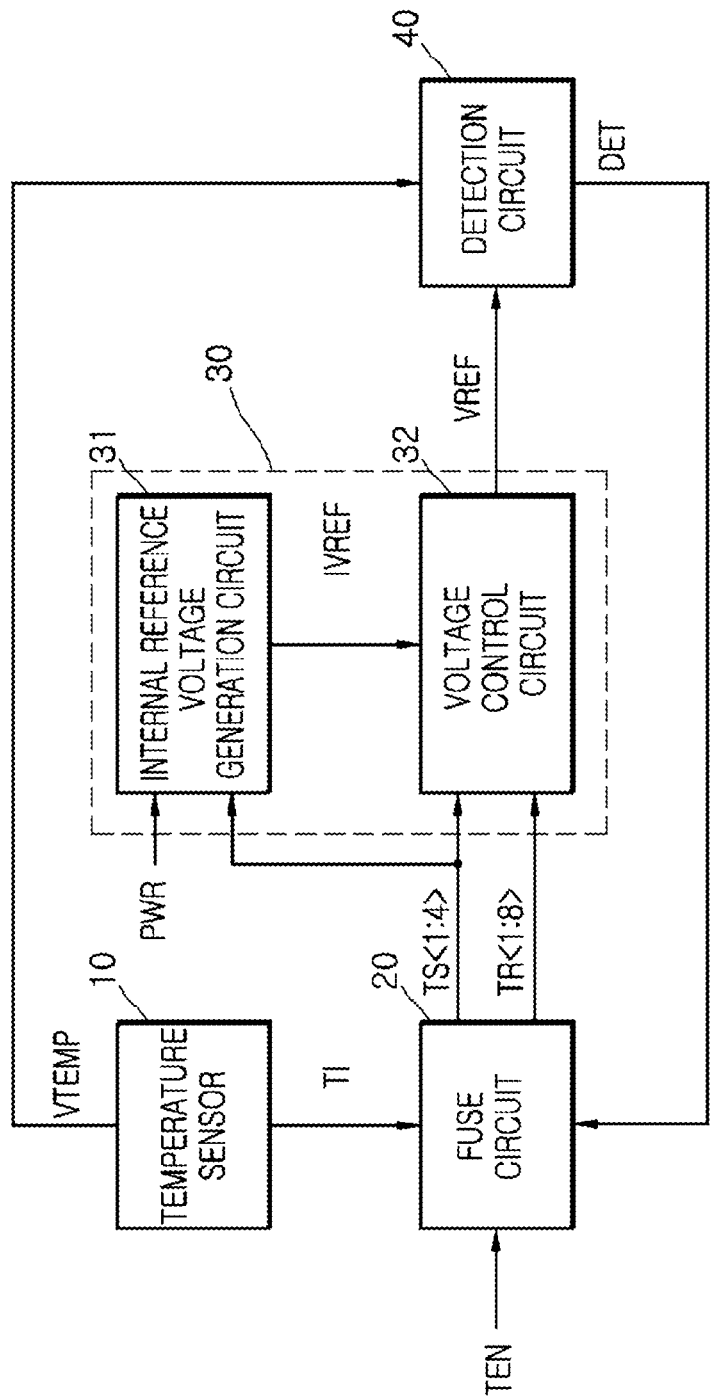
FIG. 1 is a block diagram illustrating a representation of an example of the configuration of a semiconductor device in accordance with an embodiment.

Referring to FIG. 1, a semiconductor device in accordance with an embodiment may include a temperature sensor 10, a fuse circuit 20, a reference voltage generation circuit 30, and a detection circuit 40.

The temperature sensor 10 may generate a temperature information signal TI which has the internal temperature information of the semiconductor device and a temperature voltage VTEMP which is changed in its level depending on an internal temperature. The temperature sensor 10 may generate the temperature information signal TI which is enabled in the case where the internal temperature of the semiconductor device is a first temperature (i.e., high temperature) and is disabled in the case where the internal temperature of the semiconductor device is a second temperature (i.e., low temperature). The temperature sensor 10 may generate the temperature information signal TI which is disabled after being enabled for a predetermined period in a test mode. The predetermined period may be set as a period for counting all of first code signals TS<1:4> and second code signals TR<1:8> which will be described later. The temperature sensor 10 may generate the temperature voltage VTEMP which is raised or lowered in its level as the internal temperature of the semiconductor device increases. According to an embodiment, the temperature sensor 10 may be realized by a temperature sensor such as a DTSR (digital temperature sensor regulator) and an ATSR (analog temperature sensor regulator). The test mode may be set as a test mode in which a reference voltage training operation for controlling the level of a reference voltage VREF is performed.

The fuse circuit 20 may generate the first code signals TS<1:4> and the second code signals TR<1:8> which are sequentially counted in the test mode. The fuse circuit 20 may generate the first code signals TS<1:4> and the second code signals TR<1:8> which are sequentially counted, in response to an enable signal TEN and the temperature information signal TI. The fuse circuit 20 may store the first code signals TS<1:4> and the second code signals TR<1:8> in response to the temperature information signal TI and a detection signal DET. The fuse circuit 20 may output the first code signals TS<1:4> and the second code signals TR<1:8> stored therein, after the test mode.

The reference voltage generation circuit 30 may include an internal reference voltage generation circuit 31 and a voltage control circuit 32.

The internal reference voltage generation circuit 31 may be controlled in its internal resistance value depending on the first code signals TS<1:4> in response to a power-up signal PWR, and may generate an internal reference voltage IVREF, a level of which is controlled depending on the internal resistance value. The internal reference voltage generation circuit 31 may generate the internal reference voltage IVREF of which level is raised, in the case where the first code signals TS<1:4> are counted. According to an embodiment, the internal reference voltage generation circuit 31 may be realized to generate the internal reference voltage IVREF of which level is lowered, in the case where the first code signals TS<1:4> are counted.

The voltage control circuit 32 may control the level of the internal reference voltage IVREF depending on the first code signals TS<1:4> and the second code signals TR<1:8>, and generate the reference voltage VREF. The voltage control circuit 32 may output, as the reference voltage VREF, any one of a plurality of divided voltages VD1 to VD8 (see FIG. 4) depending on the first code signals TS<1:4> and the second code signals TR<1:8>.

The reference voltage generation circuit 30 in accordance with an embodiment, realized in this way, may control the level of the reference voltage VREF depending on the internal resistance value controlled in response to the first code signals TS<1:4> and the second code signals TR<1:8> at the first temperature (i.e., high temperature), and may control the level of the reference voltage VREF depending on the internal resistance value controlled in response to the first code signals TS<1:4> and the second code signals TR<1:8> at the second temperature (i.e., low temperature).

The detection circuit 40 may compare the levels of the temperature voltage VTEMP and the reference voltage VREF, and may generate the detection signal DET. The detection circuit 40 may compare the levels of the temperature voltage VTEMP and the reference voltage VREF, and may generate the detection signal DET which is enabled in the case where an operation for controlling the level of the reference voltage VREF is completed. The case where the operation for controlling the level of the reference voltage VREF is completed may be set as the case where the level of the reference voltage VREF is controlled to the same level as the temperature voltage VTEMP. Also, the case where the operation for controlling the level of the reference voltage VREF is completed may be set as the case where the level of the reference voltage VREF reaches a target voltage value set by the temperature voltage VTEMP.

Figure 2:
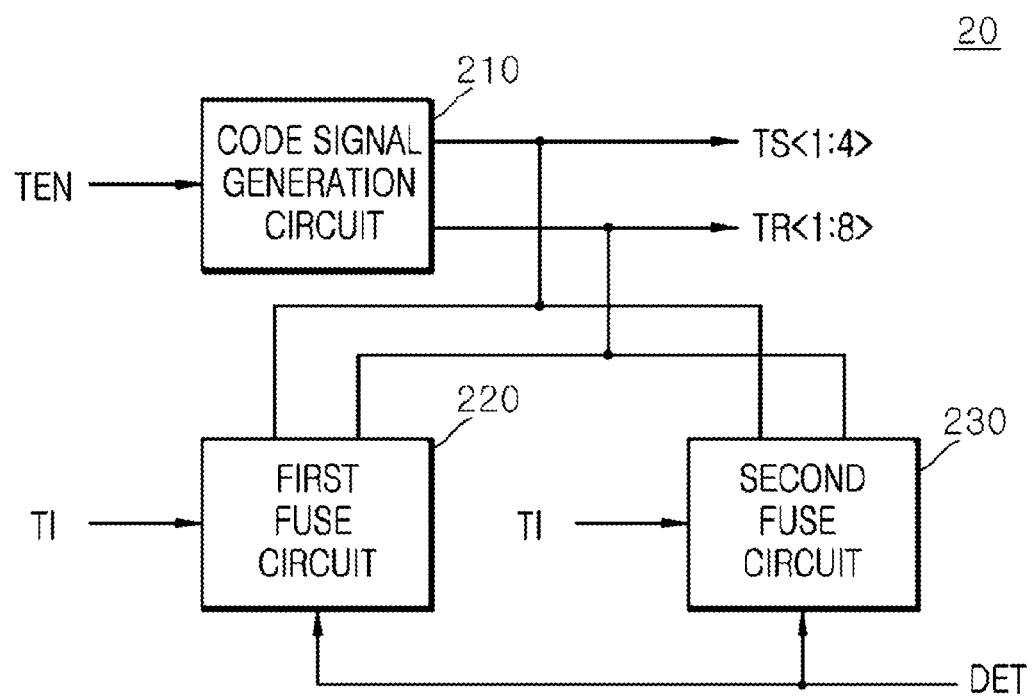
FIG. 2 is a block diagram illustrating a representation of an example of the internal configuration of the fuse circuit included in the semiconductor device illustrated in FIG. 1.

Referring to FIG. 2, the fuse circuit 20 in accordance with an embodiment may include a code signal generation circuit 210, a first fuse circuit 220 and a second fuse circuit 230.

The code signal generation circuit 210 may generate the first code signals TS<1:4> and the second code signals TR<1:8> which are sequentially counted in the test mode. The code signal generation circuit 210 may generate the first code signals TS<1:4> and the second code signals TR<1:8> which are counted in response to the enable signal TEN. The code signal generation circuit 210 may generate the first code signals TS<1:4> and the second code signals TR<1:8> which are up-counted or down-counted in response to the enable signal TEN, according to an embodiment. The code signal generation circuit 210 may sequentially count and generate all the bits of the second code signals TR<1:8>, during a period in which any one of the first code signals TS<1:4> is counted. The enable signal TEN may be set as a signal which is enabled in the test mode in which the reference voltage training operation for controlling the level of the reference voltage VREF is performed.

The first fuse circuit 220 may store the first code signals TS<1:4> and the second code signals TR<1:8> in the case where the operation for controlling the level of the reference voltage VREF is completed at the first temperature (i.e., high temperature). The first fuse circuit 220 may store the first code signals TS<1:4> and the second code signals TR<1:8> in the case where the detection signal DET is enabled in response to the temperature information signal TI. The first fuse circuit 220 may store the first code signals TS<1:4> and the second code signals TR<1:8> in the case where the detection signal DET is enabled during the enable period of the temperature information signal TI. The first fuse circuit 220 may output the first code signals TS<1:4> and the second code signals TR<1:8> stored therein at the first temperature (i.e., high temperature), after the test mode. The first fuse circuit 220 may output the first code signals TS<1:4> and the second code signals TR<1:8> stored therein during the enable period of the temperature information signal TI, after the test mode. The first fuse circuit 220 may be realized by a fuse array which includes a plurality of fuse cells.

The second fuse circuit 230 may store the first code signals TS<1:4> and the second code signals TR<1:8> in the case where the operation for controlling the level of the reference voltage VREF is completed at the second temperature (i.e., low temperature). The second fuse circuit 230 may store the first code signals TS<1:4> and the second code signals TR<1:8> in the case where the detection signal DET is enabled in response to the temperature information signal TI. The second fuse circuit 230 may store the first code signals TS<1:4> and the second code signals TR<1:8> in the case where the detection signal DET is enabled during the disable period of the temperature information signal TI. The second fuse circuit 230 may output the first code signals TS<1:4> and the second code signals TR<1:8> stored therein at the second temperature (i.e., low temperature), after the test mode. The second fuse circuit 230 may output the first code signals TS<1:4> and the second code signals TR<1:8> stored therein during the disable period of the temperature information signal TI, after the test mode. The second fuse circuit 230 may be realized by a fuse array which includes a plurality of fuse cells.

Figure 3:
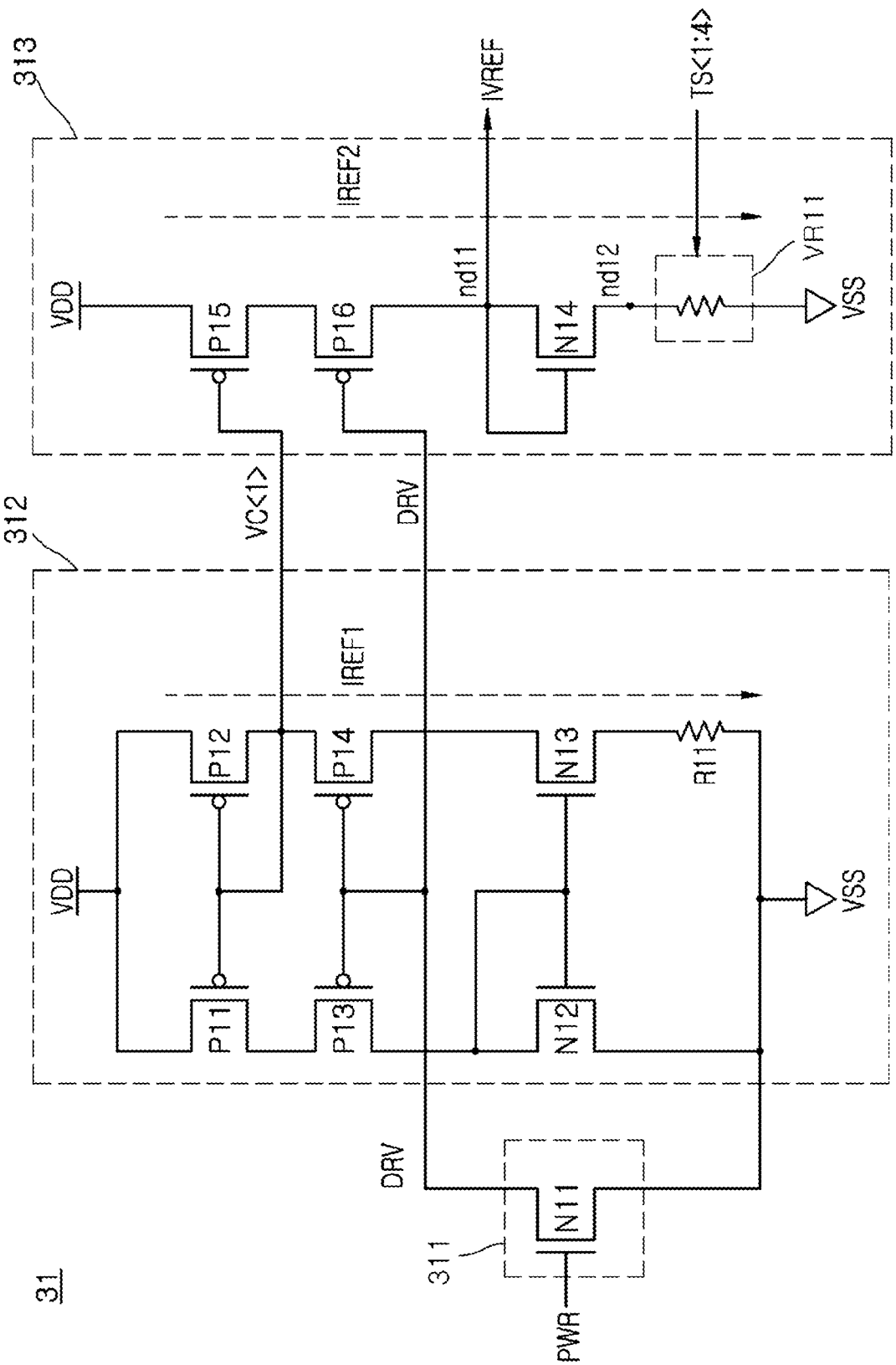
FIG. 3 is a circuit diagram illustrating a representation of an example of the internal configuration of the internal reference voltage generation circuit included in the semiconductor device illustrated in FIG. 1.

Referring to FIG. 3, the internal reference voltage generation circuit 31 in accordance with an embodiment may include a driving signal generation circuit 311, a first reference current generation circuit 312 and a second reference current generation circuit 313.

The driving signal generation circuit 311 may be realized by an NMOS transistor N11, and may generate a driving voltage DRV which has the level of a ground voltage VSS after a power-up period. The driving signal generation circuit 311 may generate the driving voltage DRV which has the level of the ground voltage VSS, in response to the power-up signal PWR. The driving signal generation circuit 311 may generate the driving voltage DRV which has the level of the ground voltage VSS, as the NMOS transistor N11 is turned on in the case where the power-up signal PWR is enabled to a logic high level. The power-up signal PWR may be set as a signal which is enabled to the logic high level after the power-up period in which the level of the power of the semiconductor device is raised from 0V depending on the level of an external voltage and reaches a target level.

The first reference current generation circuit 312 may be realized by a general current mirror type current generation circuit which is realized by PMOS transistors P11, P12, P13 and P14, NMOS transistors N12 and N13 and a resistor R11. The first reference current generation circuit 312 may generate a first control voltage VC<1> of which level is controlled in response to the driving voltage DRV and a first reference current IREF1 which has a constant current value. The first reference current generation circuit 312 may generate the first control voltage VC<1> of which level is controlled in response to the driving voltage DRV of a logic low level. A level of the first control voltage VC<1> may be controlled by the PMOS transistor P12 which supplies charges from a power supply voltage VDD and the PMOS transistor P14 which discharges the charges supplied from the PMOS transistor P12. The first reference current IREF1 may be set as a current which flows from the power supply voltage VDD through the PMOS transistors P12 and P14, the NMOS transistor N13 and the resistor R11 to the ground voltage VSS, depending on the level of the first control voltage VC<1>.

The second reference current generation circuit 313 may be realized by PMOS transistors P15 and P16 coupled in series between the power supply voltage VDD and a node nd11, an NMOS transistor N14 which is coupled between the node nd11 and a node nd12, and a variable resistor VR11 which is positioned between the node nd12 and the ground voltage VSS. The second reference current generation circuit 313 may generate a second reference current IREF2 having the same current value as the first reference current IREF1, as the PMOS transistors P15 and P16 are turned on in response to the driving voltage DRV and the first control voltage VC<1>. The second reference current generation circuit 313 may generate the internal reference voltage IVREF, a level of which is controlled depending on the internal resistance value controlled, the internal resistance value controlled depending on the first code signals TS<1:4> and the second reference current IREF2. The variable resistor VR11 of the second reference current generation circuit 313 may be controlled in its internal resistance value depending on the first code signals TS<1:4>. The variable resistor VR11 of the second reference current generation circuit 313 may be set to have a largest internal resistance value in the case where the code signal TS<1> among the first code signals TS<1:4> is generated. The variable resistor VR11 of the second reference current generation circuit 313 may be set to have a smallest internal resistance value in the case where the code signal TS<4> among the first code signals TS<1:4> is generated. The second reference current generation circuit 313 may generate the internal reference voltage IVREF of which a level is raised, in the case where the first code signals TS<1:4> are sequentially counted. The level of the internal reference voltage IVREF generated by the second reference current generation circuit 313 will be described later with reference to FIG. 5.

Figure 4:
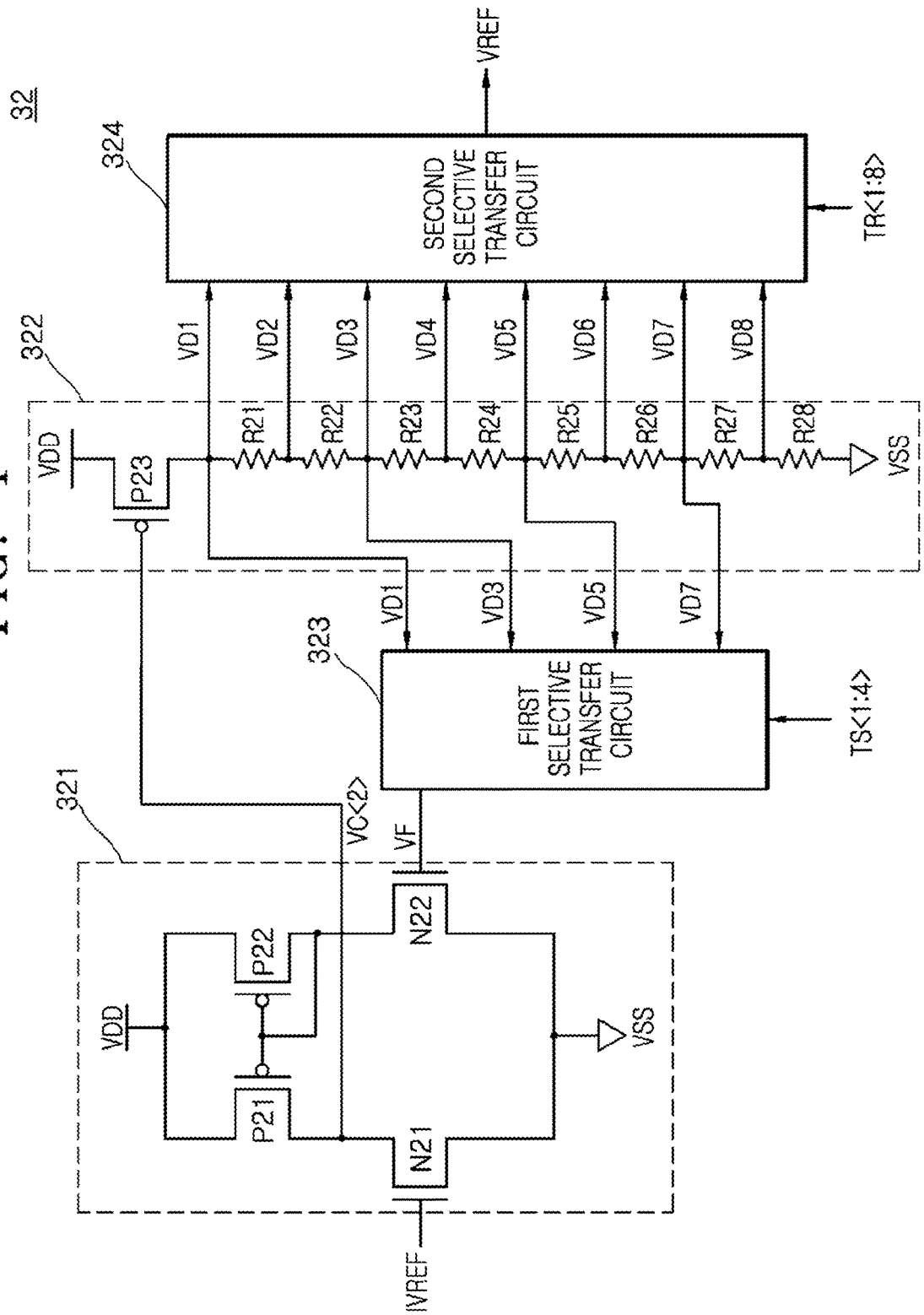
FIG. 4 is a diagram illustrating a representation of an example of the internal configuration of the voltage control circuit included in the semiconductor device illustrated in FIG. 1.

Referring to FIG. 4, the voltage control circuit 32 in accordance with an embodiment may include a comparison circuit 321, a voltage division circuit 322, a first selective transfer circuit 323, and a second selective transfer circuit 324.

The comparison circuit 321 may be realized by a general differential amplification circuit which is realized by PMOS transistors P21 and P22 and NMOS transistors N21 and N22. The comparison circuit 321 may compare the internal reference voltage IVREF and a feedback voltage VF, and may generate a second control voltage VC<2>.

The voltage division circuit 322 may be realized by a general voltage division circuit which is realized by a PMOS transistor P23 and a plurality of resistors R21, R22, R23, R24, R25, R26, R27 and R28. The voltage division circuit 322 may generate first to eighth divided voltages VD1 to VD8 as the power supply voltage VDD is divided in the case where the PMOS transistor P23 is turned on in response to the second control voltage VC<2>. The levels of the first to eighth divided voltages VD1 to VD8 may sequentially decrease from the first divided voltage VD1.

The first selective transfer circuit 323 may output any one of the first divided voltage VD1, the third divided voltage VD3, the fifth divided voltage V5 and the seventh divided voltage VD7, as the feedback voltage VF, in response to the first code signals TS<1:4>. The first selective transfer circuit 323 may output the first divided voltage VD1 as the feedback voltage VF in the case where the code signal TS<1> among the first code signals TS<1:4> is generated. The first selective transfer circuit 323 may output the third divided voltage VD3 as the feedback voltage VF in the case where the code signal TS<2> among the first code signals TS<1:4> is generated. The first selective transfer circuit 323 may output the fifth divided voltage VD5 as the feedback voltage VF in the case where the code signal TS<3> among the first code signals TS<1:4> is generated. The first selective transfer circuit 323 may output the seventh divided voltage VD7 as the feedback voltage VF in the case where the code signal TS<4> among the first code signals TS<1:4> is generated.

The second selective transfer circuit 324 may output any one among the first to eighth divided voltages VD1 to VD8, as the reference voltage VREF, in response to the second code signals TR<1:8>. The second selective transfer circuit 324 may output the first divided voltage VD1 as the reference voltage VREF in the case where the code signal TR<1> among the second code signals TR<1:8> is generated. The second selective transfer circuit 324 may output the second divided voltage VD2 as the reference voltage VREF in the case where the code signal TR<2> among the second code signals TR<1:8> is generated. The second selective transfer circuit 324 may output the third divided voltage VD3 as the reference voltage VREF in the case where the code signal TR<3> among the second code signals TR<1:8> is generated. The second selective transfer circuit 324 may output the fourth divided voltage VD4 as the reference voltage VREF in the case where the code signal TR<4> among the second code signals TR<1:8> is generated. The second selective transfer circuit 324 may output the fifth divided voltage VD5 as the reference voltage VREF in the case where the code signal TR<5> among the second code signals TR<1:8> is generated. The second selective transfer circuit 324 may output the sixth divided voltage VD6 as the reference voltage VREF in the case where the code signal TR<6> among the second code signals TR<1:8> is generated. The second selective transfer circuit 324 may output the seventh divided voltage VD7 as the reference voltage VREF in the case where the code signal TR<7> among the second code signals TR<1:8> is generated. The second selective transfer circuit 324 may output the eighth divided voltage VD8 as the reference voltage VREF in the case where the code signal TR<8> among the second code signals TR<1:8> is generated.

Figure 5:
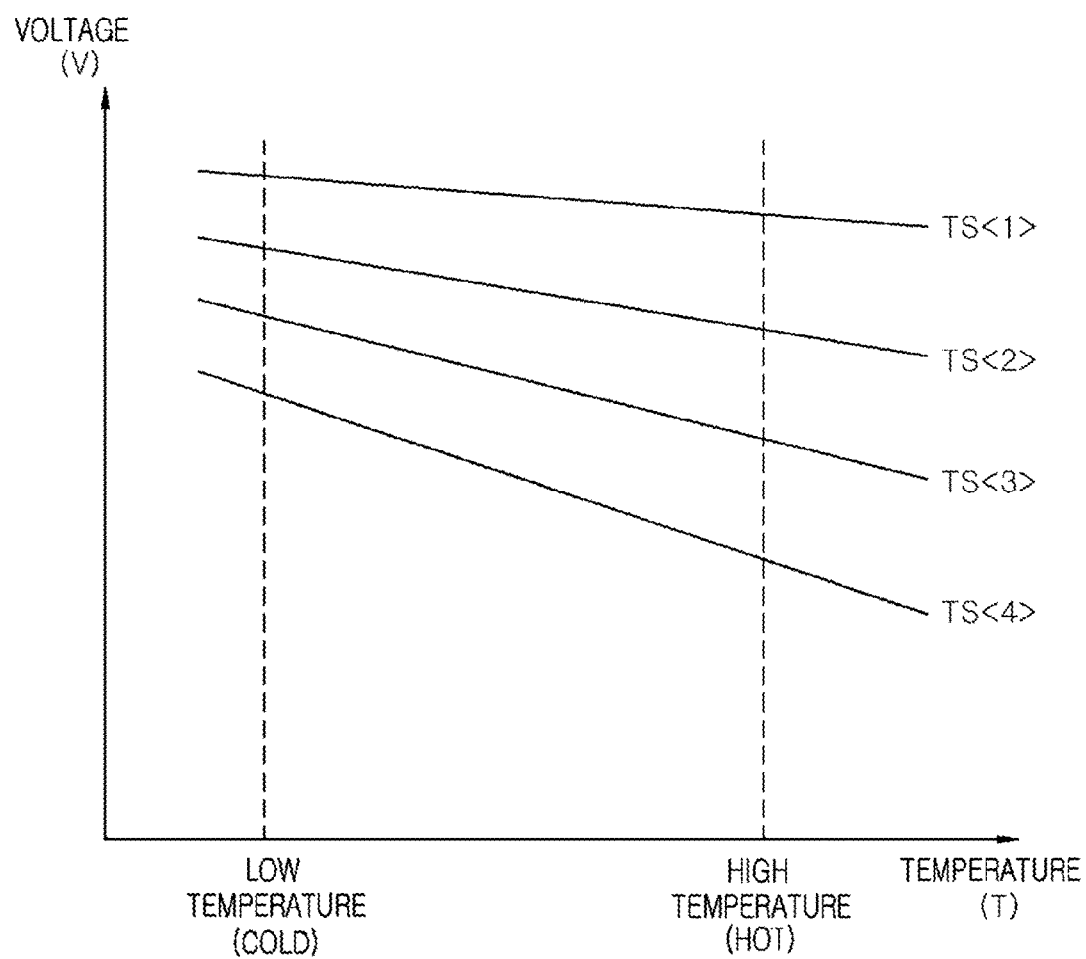
FIGS. 5 to 7 are representations of examples of graphs to assist in the explanation of the operation of the semiconductor device illustrated in FIG. 1.

The level of the internal reference voltage IVREF generated depending on the first code signals TS<1:4> in accordance with an embodiment will be described below with reference to FIG. 5.

In the case where the code signal TS<1> among the first code signals TS<1:4> is generated, the internal reference voltage IVREF is generated and the level of the internal reference voltage IVREF is decreased from the second temperature (i.e., low temperature) toward the first temperature (i.e., high temperature).

In the case where the code signal TS<2> among the first code signals TS<1:4> is generated, the internal reference voltage IVREF is generated to a level lower than the case where the code signal TS<1> is generated and the level of the internal reference voltage IVREF is decreased from the second temperature (i.e., low temperature) toward the first temperature (i.e., high temperature).

In the case where the code signal TS<3> among the first code signals TS<1:4> is generated, the internal reference voltage IVREF is generated to a level lower than the case where the code signal TS<2> is generated and the level of the internal reference voltage IVREF is decreased from the second temperature (i.e., low temperature) toward the first temperature (i.e., high temperature).

In the case where the code signal TS<4> among the first code signals TS<1:4> is generated, the internal reference voltage IVREF is generated to a level lower than the case where the code signal TS<3> is generated and the level of the internal reference voltage IVREF is decreased from the second temperature (i.e., low temperature) toward the first temperature (i.e., high temperature).

In this way, as the first code signals TS<1:4> are counted, the internal reference voltage IVREF is generated such that the level of the internal reference voltage IVREF decreases and the variation amount (gradient) of the internal reference voltage IVREF increases. Also, the internal reference voltage IVREF is generated such that the level of the internal reference voltage IVREF decreases from the second temperature (i.e., low temperature) toward the first temperature (i.e., high temperature).

Figure 6:
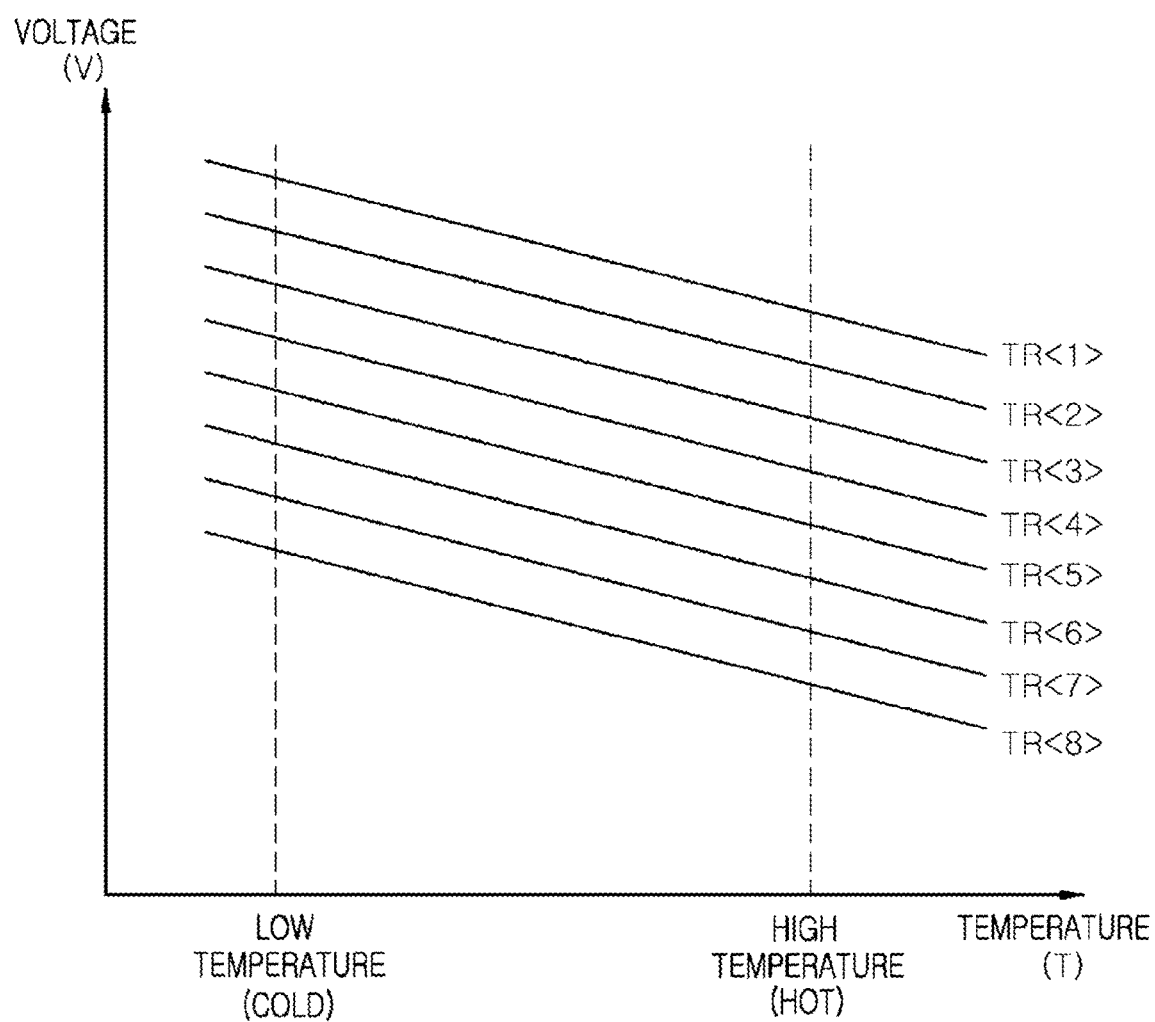

The level of the reference voltage VREF generated depending on the second code signals TR<1:8> in accordance with an embodiment will be described below with reference to FIG. 6.

In the case where the code signal TR<1> among the second code signals TR<1:8> is generated, the level of the reference voltage VREF is generated to decrease from the second temperature (i.e., low temperature) toward the first temperature (i.e., high temperature).

In the case where the code signal TR<2> among the second code signals TR<1:8> is generated, the level of the reference voltage VREF is generated to a level lower than the case where the code signal TR<1> is generated and decreases from the second temperature (i.e., low temperature) toward the first temperature (i.e., high temperature).

In the case where the code signal TR<3> among the second code signals TR<1:8> is generated, the level of the reference voltage VREF is generated to a level lower than the case where the code signal TR<2> is generated and decreases from the second temperature (i.e., low temperature) toward the first temperature (i.e., high temperature).

In the case where the code signal TR<4> among the second code signals TR<1:8> is generated, the level of the reference voltage VREF is generated to a level lower than the case where the code signal TR<3> is generated and decreases from the second temperature (i.e., low temperature) toward the first temperature (i.e., high temperature).

In the case where the code signal TR<5> among the second code signals TR<1:8> is generated, the level of the reference voltage VREF is generated to a level lower than the case where the code signal TR<4> is generated and decreases from the second temperature (i.e., low temperature) toward the first temperature (i.e., high temperature).

In the case where the code signal TR<6> among the second code signals TR<1:8> is generated, the level of the reference voltage VREF is generated to a level lower than the case where the code signal TR<5> is generated and decreases from the second temperature (i.e., low temperature) toward the first temperature (i.e., high temperature).

In the case where the code signal TR<7> among the second code signals TR<1:8> is generated, the level of the reference voltage VREF is generated to a level lower than the case where the code signal TR<6> is generated and decreases from the second temperature (i.e., low temperature) toward the first temperature (i.e., high temperature).

In the case where the code signal TR<8> among the second code signals TR<1:8> is generated, the level of the reference voltage VREF is generated to a level lower than the case where the code signal TR<7> is generated and decreases from the second temperature (i.e., low temperature) toward the first temperature (i.e., high temperature).

In this way, the reference voltage VREF is generated such that the level of the reference voltage VREF decreases as the second code signals TR<1:8> are counted. Also, the reference voltage VREF is generated such that the level of the reference voltage VREF decreases from the second temperature (i.e., low temperature) toward the first temperature (i.e., high temperature).

Figure 7:
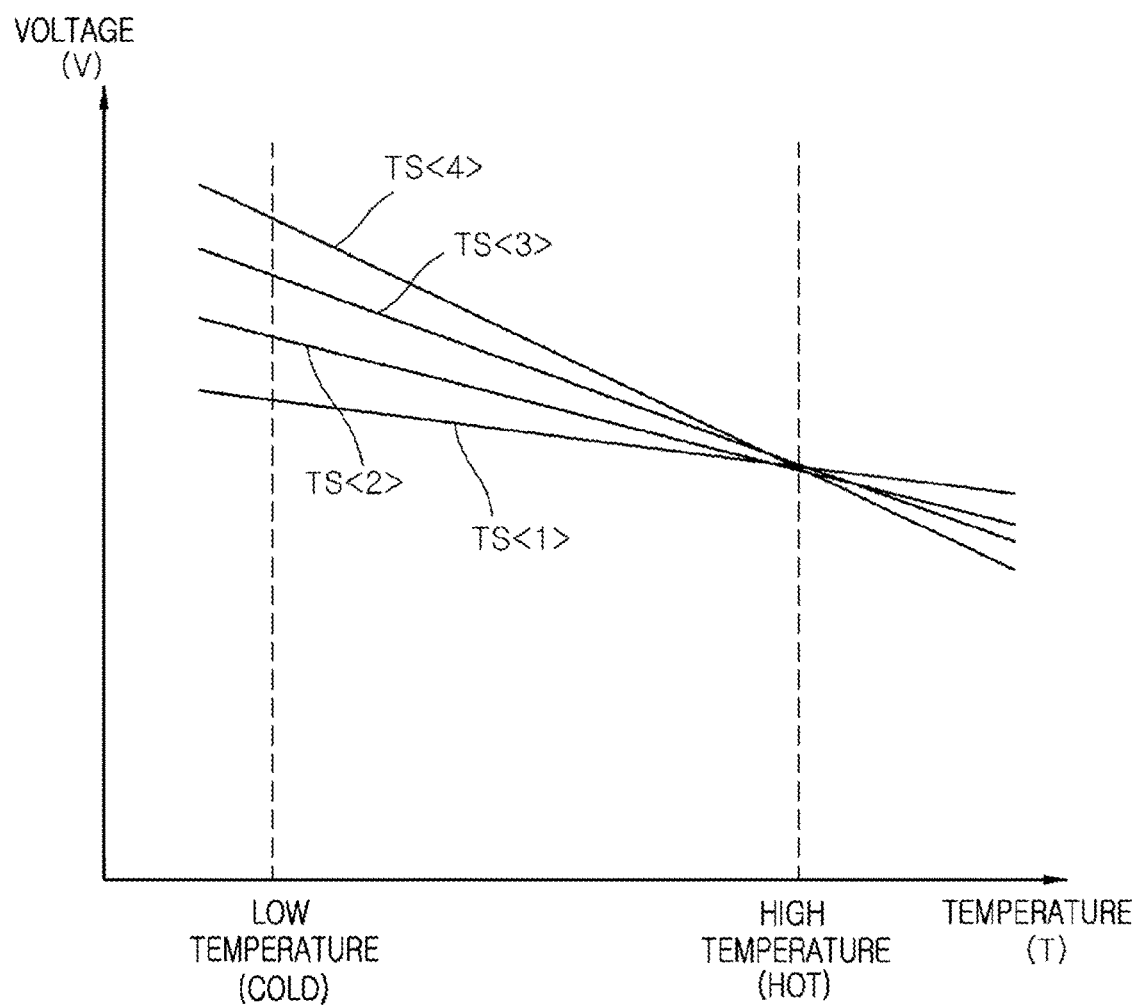

The operation of controlling the level of the reference voltage VREF in the semiconductor device in accordance with an embodiment will be described below with reference to FIG. 7, by providing an example of the operation of controlling the level of the reference voltage VREF depending on the code signals TS<1:2> among the first code signals TS<1:4> at the first temperature (high temperature).

First, the operation of controlling the level of the reference voltage VREF depending on the code signal TS<1> among the first code signals TS<1:4> at the first temperature (i.e., high temperature) will be explained for example.

The temperature sensor 10 generates the temperature information signal TI enabled at the first temperature (i.e., high temperature) and the temperature voltage VTEMP having a level corresponding to the first temperature (i.e., high temperature).

The fuse circuit 20 counts the code signal TS<1> among the first code signals TS<1:4>, and sequentially counts the second code signals TR<1:8>.

The internal reference voltage generation circuit 31 is controlled in its internal resistance value depending on the code signal TS<1>, and generates the internal reference voltage IVREF, a level of which is controlled depending on the internal resistance value.

The voltage control circuit 32 controls the level of the internal reference voltage IVREF depending on the code signal TS<1> and the second code signals TR<1:8> counted, and generates the reference voltage VREF. The level of the reference voltage VREF is controlled to the same level as the temperature voltage VTEMP.

The detection circuit 40 compares the levels of the temperature voltage VTEMP and the reference voltage VREF, and generates the detection signal DET.

The fuse circuit 20 stores the first code signals TS<1:4> and the second code signals TR<1:8> in response to the detection signal DET.

Next, the operation of controlling the level of the reference voltage VREF depending on the code signal TS<2> among the first code signals TS<1:4> at the first temperature (i.e., high temperature) will be discussed, for example.

The temperature sensor 10 generates the temperature information signal TI enabled at the first temperature (i.e., high temperature) and the temperature voltage VTEMP having a level corresponding to the first temperature (i.e., high temperature).

The fuse circuit 20 counts the code signal TS<2> among the first code signals TS<1:4>, and sequentially counts the second code signals TR<1:8>.

The internal resistance value of the internal reference voltage generation circuit 31 is controlled depending on the code signal TS<2>, and the internal reference voltage generation circuit 31 generates the internal reference voltage IVREF of which its level is controlled depending on the internal resistance value.

The voltage control circuit 32 controls the level of the internal reference voltage IVREF depending on the code signal TS<2> and the second code signals TR<1:8> counted, and generates the reference voltage VREF. The level of the reference voltage VREF is controlled to the same level as the temperature voltage VTEMP.

The detection circuit 40 compares the levels of the temperature voltage VTEMP and the reference voltage VREF, and generates the detection signal DET.

The fuse circuit 20 stores the first code signals TS<1:4> and the second code signals TR<1:8> in response to the detection signal DET.

Meanwhile, since the operation of controlling the level of the reference voltage VREF depending on the code signals TS<3:4> at the first temperature (i.e., high temperature) is the same as the operation of controlling the level of the reference voltage VREF depending on the code signals TS<1:2>, descriptions thereof will be omitted herein. Further, since the operation of controlling the level of the reference voltage VREF at the second temperature (i.e., low temperature) is the same as the operation of controlling the level of the reference voltage VREF at the first temperature (i.e., high temperature), descriptions thereof will be omitted herein.

As is apparent from the above descriptions, in a semiconductor device according to an embodiment, the level of a reference voltage may be controlled in the cases where an internal temperature is a high temperature and a low temperature, and code signals for controlling the level of the reference voltage for a high temperature and a low temperature according to a result of controlling the level of the reference voltage may be used by being stored, whereby it may be possible to generate a stable reference voltage even though a temperature varies.

Figure 8:
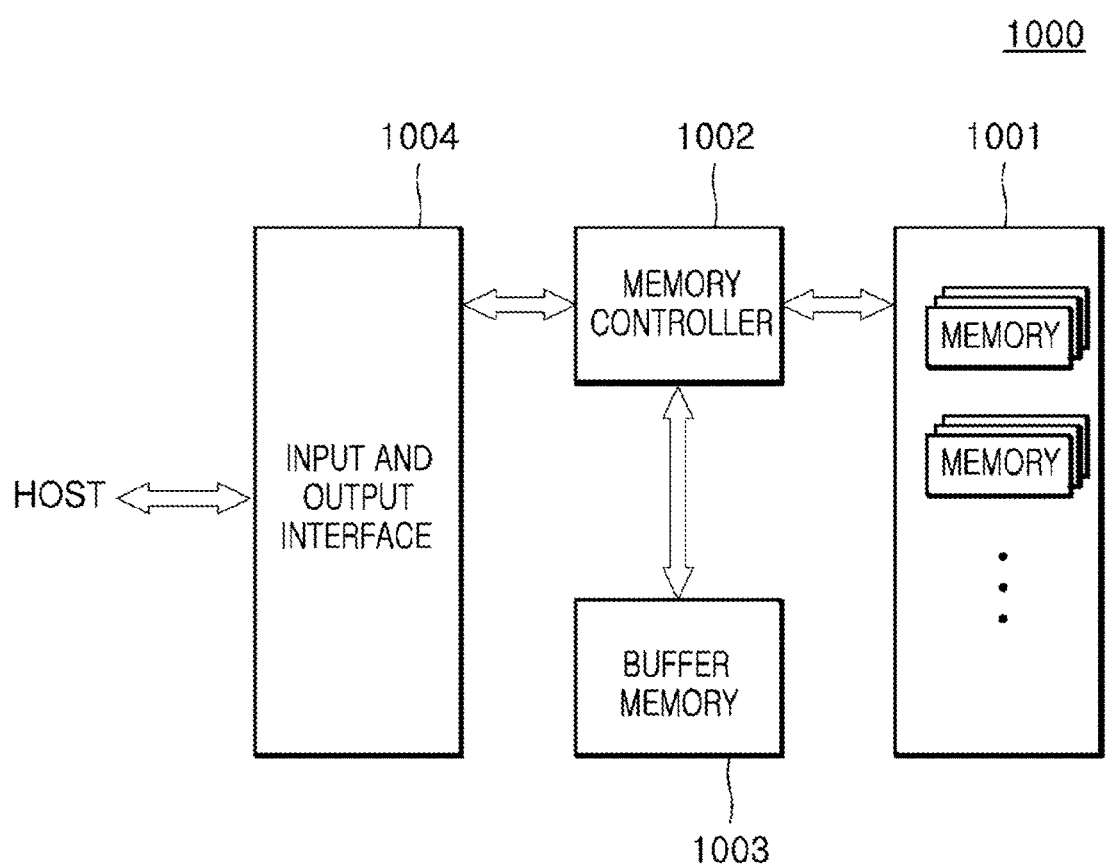
FIG. 8 is a diagram illustrating a representation of an example of the configuration of an electronic system to which the semiconductor device illustrated in FIGS. 1 to 7 is applied.

The semiconductor devices and the semiconductor systems described above with reference to FIGS. 1 to 7 may be applied to an electronic system which includes a memory system, a graphic system, a computing system or a mobile system. For example, referring to FIG. 8, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control voltages from the memory controller 1002. The data storage 1001 may include the semiconductor device illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 8, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control voltage. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control voltages for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
    a fuse circuit suitable for outputting a first code signals and a second code signals which are sequentially counted, in a test mode, and storing the first code signals and the second code signals based on a temperature information signal; and
    a reference voltage generation circuit suitable for controlling a level of a reference voltage depending on an internal resistance value controlled based on the first code signals and the second code signals at a first temperature, and controlling the level of the reference voltage depending on the internal resistance value controlled based on the first code signals and the second code signals at a second temperature.

2. The semiconductor device according to claim 1, wherein the reference voltage generation circuit comprises:
    an internal reference voltage generation circuit suitable for controlling the internal resistance value depending on the first code signals based on a power-up signal, and generating an internal reference voltage, a level of the internal reference voltage is controllable by the internal resistance value; and
    a voltage control circuit suitable for controlling the level of the internal reference voltage depending on the first code signals and the second code signals, and generating the reference voltage.

3. The semiconductor device according to claim 2, wherein the internal reference voltage generation circuit comprises:
    a driving signal generation circuit suitable for generating a driving voltage which is enabled in response to the power-up signal;
    a first reference current generation circuit suitable for generating a first control voltage, a level of which is controllable based on the driving voltage, and a first reference current which has a constant current value; and
    a second reference current generation circuit suitable for generating a second reference current which has the same current value as the first reference current, in response to the driving voltage and the first control voltage, and generating the internal reference voltage, a level of which is controllable depending on the internal resistance value controlled depending on the first code signals and the second reference current.

4. The semiconductor device according to claim 3, wherein the second reference current generation circuit comprises a variable resistor in which the internal resistance value is controlled by the first code signals.

5. The semiconductor device according to claim 2, wherein the voltage control circuit comprises:
    a comparison circuit suitable for comparing the internal reference voltage and a feedback voltage, and generating a second control voltage;
    a voltage division circuit suitable for generating first to fourth divided voltages which are generated from a power supply voltage being divided based on the second control voltage;
    a first selective transfer circuit suitable for outputting any one of the first divided voltage and the third divided voltage, as the feedback voltage, based on the first code signals; and
    a second selective transfer circuit suitable for outputting any one of the first to fourth divided voltages, as the reference voltage, based on the second code signals.

6. The semiconductor device according to claim 1, wherein the fuse circuit comprises:
    a code signal generation circuit suitable for outputting the first code signals and the second code signals which are counted, based on an enable signal;
    a first fuse circuit suitable for storing the first code signals and the second code signals based on an operation for controlling the level of the reference voltage generated at the first temperature being completed, based on the temperature information signal; and
    a second fuse circuit suitable for storing the first code signals and the second code signals based on an operation for controlling the level of the reference voltage generated at the second temperature being completed, based on the temperature information signal.

7. The semiconductor device according to claim 6,
    wherein the first fuse circuit outputs the first code signals and the second code signals stored at the first temperature, based on the test mode being exited, and
    wherein the second fuse circuit outputs the first code signals and the second code signals stored at the second temperature, based on the test mode being exited.

8. A semiconductor device comprising:
    a temperature sensor suitable for generating a temperature information signal which is enabled at a first temperature and is disabled at a second temperature, and generating a temperature voltage, a level of which is changeable depending on the first temperature and the second temperature;
    a fuse circuit suitable for outputting first code signals and second code signals which are counted in a test mode, storing the first code signals and the second code signals based on the temperature information signal, and outputting the first code signals and the second code signals after the test mode; and
    a reference voltage generation circuit suitable for controlling a level of a reference voltage depending on an internal resistance value controlled based on the first code signals and the second code signals at the first temperature, and controlling the level of the reference voltage depending on the internal resistance value controlled based on the first code signals and the second code signals at the second temperature.

9. The semiconductor device according to claim 8, wherein the fuse circuit comprises:
    a code signal generation circuit suitable for outputting the first code signals and the second code signals which are counted, based on an enable signal;
    a first fuse circuit suitable for storing the first code signals and the second code signals based on the temperature information signal and a detection signal; and
    a second fuse circuit suitable for storing the first code signals and the second code signals based on the temperature information signal and the detection signal.

10. The semiconductor device according to claim 9, wherein the detection signal is a signal which is enabled based on an operation for controlling the level of the reference voltage generated at the first temperature and the second temperature being completed.

11. The semiconductor device according to claim 9,
    wherein the first fuse circuit outputs the first code signals and the second code signals stored at the first temperature, based on the test mode being exited, and
    wherein the second fuse circuit outputs the first code signals and the second code signals stored at the second temperature, based on the test mode being exited.

12. The semiconductor device according to claim 8, wherein the reference voltage generation circuit comprises:
- an internal reference voltage generation circuit suitable for controlling the internal resistance value depending on the first code signals based on a power-up signal, and generating an internal reference voltage, a level of which is controllable by the internal resistance value; and
- a voltage control circuit suitable for controlling the level of the internal reference voltage depending on the first code signals and the second code signals, and generating the reference voltage.

13. The semiconductor device according to claim 12, wherein the internal reference voltage generation circuit comprises:
- a driving signal generation circuit suitable for generating a driving voltage which is enabled in response to the power-up signal;
- a first reference current generation circuit suitable for generating a first control voltage, a level of which is controllable based on the driving voltage and a first reference current which has a constant current value; and
- a second reference current generation circuit suitable for generating a second reference current which has the same current value as the first reference current, in response to the driving voltage and the first control voltage, and generating the internal reference voltage, a level of which is controllable in its level depending on the internal resistance value controlled depending on the first code signals and the second reference current.

14. The semiconductor device according to claim 13, wherein the second reference current generation circuit comprises a variable resistor in which the internal resistance value is controlled by the first code signals.

15. The semiconductor device according to claim 12, wherein the voltage control circuit comprises:
- a comparison circuit suitable for comparing the internal reference voltage and a feedback voltage, and generating a second control voltage;
- a voltage division circuit suitable for generating first to fourth divided voltages which are generated from a power supply voltage being divided based on the second control voltage;
- a first selective transfer circuit suitable for outputting any one of the first divided voltage and the third divided voltage, as the feedback voltage, based on the first code signals; and
- a second selective transfer circuit suitable for outputting any one of the first to fourth divided voltages, as the reference voltage, based on the second code signals.

16. A semiconductor device comprising:
- an internal reference voltage generation circuit suitable for controlling an internal resistance value depending on first code signals at a first temperature, generating an internal reference voltage, a level of which is controllable by the internal resistance value, controlling the internal resistance value depending on the first code signals at a second temperature, and generating the internal reference voltage, a level of which is controllable by the internal resistance value;
- a voltage control circuit suitable for controlling the level of the internal reference voltage depending on the first code signals and second code signals, and generating a reference voltage; and
- a detection circuit suitable for comparing levels of a temperature voltage, a level of which is changeable at the first temperature and the second temperature and the reference voltage, and generating a detection signal.

17. The semiconductor device according to claim 16, wherein the internal reference voltage generation circuit comprises:
- a driving signal generation circuit suitable for generating a driving voltage which is enabled in response to a power-up signal;
- a first reference current generation circuit suitable for generating a first control voltage, a level of which is controllable based on the driving voltage, and a first reference current which has a constant current value; and
- a second reference current generation circuit suitable for generating a second reference current which has the same current value as the first reference current, in response to the driving voltage and the first control voltage, and generating the internal reference voltage, a level of which is controllable depending on the internal resistance value controlled depending on the first code signals and the second reference current.

18. The semiconductor device according to claim 17, wherein the second reference current generation circuit comprises a variable resistor in which the internal resistance value is controlled by the first code signals.

19. The semiconductor device according to claim 17, wherein the voltage control circuit comprises:
- a comparison circuit suitable for comparing the internal reference voltage and a feedback voltage, and generating a second control voltage;
- a voltage division circuit suitable for generating first to fourth divided voltages which are generated from a power supply voltage being divided based on the second control voltage;
- a first selective transfer circuit suitable for outputting any one of the first divided voltage and the third divided voltage, as the feedback voltage, based on the first code signals; and
- a second selective transfer circuit suitable for outputting any one of the first to fourth divided voltages, as the reference voltage, based on the second code signals.

* * * * *